United States Patent
Lam et al.

(10) Patent No.: US 10,496,780 B1
(45) Date of Patent: Dec. 3, 2019

(54) DYNAMIC MODEL GENERATION FOR LITHOGRAPHIC SIMULATION

(71) Applicant: Mentor Graphics Corporation, Wilsonville, OR (US)

(72) Inventors: Michael Christopher Lam, Sunnyvale, CA (US); Germain Louis Fenger, Gladstone, OR (US); Ananthan Raghunathan, San Jose, CA (US); Konstantinos G. Adam, Belmont, CA (US); Christopher Heinz Clifford, Alameda, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 136 days.

(21) Appl. No.: 15/724,264

(22) Filed: Oct. 3, 2017

Related U.S. Application Data

(60) Provisional application No. 62/410,147, filed on Oct. 19, 2016.

(51) Int. Cl.
| | |
|---|---|
| *G06F 17/50* | (2006.01) |
| *G03F 7/00* | (2006.01) |
| *H01L 21/027* | (2006.01) |
| *G03F 1/36* | (2012.01) |
| *G03F 7/20* | (2006.01) |

(52) U.S. Cl.
CPC ............ *G06F 17/5081* (2013.01); *G03F 1/36* (2013.01); *G03F 7/705* (2013.01); *G03F 7/70441* (2013.01); *G06F 17/5009* (2013.01); *H01L 21/0274* (2013.01)

(58) Field of Classification Search
None
See application file for complete search history.

(56) References Cited

U.S. PATENT DOCUMENTS

| | | | | |
|---|---|---|---|---|
| 6,807,663 | B2 * | 10/2004 | Cote | ................... G06F 17/5068 716/53 |
| 7,065,738 | B1 * | 6/2006 | Kim | ......................... G03F 1/36 716/53 |
| 7,350,183 | B2 * | 3/2008 | Cui | ........................... G03F 1/36 430/5 |

(Continued)

OTHER PUBLICATIONS

J. Word et al., "Full-chip model-based correction of flare-induced linewidth variation," Proc. SPIE 5567, 24th Annual BACUS Symposium on Photomask Technology, 2004, pp. 700-710. (Year: 2004).*

(Continued)

*Primary Examiner* — Leigh M Garbowski

(57) ABSTRACT

Disclosed are techniques for processing layout designs based on dynamically-generated lithographic models. Lithographic models are determined for a plurality of regions of a reticle prior to lithographic simulation. During lithographic simulation, lithographic models for a small area within a particular region are generated based on the lithographic models for the particular region, the lithographic models for one or more neighboring regions, and location information of the small area relative to the region and to the one or more neighboring regions. The lithography models comprise illuminating and imaging system models and mask electro-magnetic field models.

21 Claims, 10 Drawing Sheets

(56) References Cited

U.S. PATENT DOCUMENTS

| | | | |
|---|---|---|---|
| 7,383,530 B2* | 6/2008 | Wang | G03F 1/36 430/30 |
| 7,392,502 B2* | 6/2008 | Percin | G03F 1/36 430/30 |
| 7,475,383 B2* | 1/2009 | Suh | G03F 1/36 378/35 |
| 7,536,660 B2 | 2/2009 | Adam | |
| 7,539,954 B2 | 5/2009 | Adam | |
| 7,694,267 B1* | 4/2010 | Ye | G03F 1/144 716/53 |
| 7,788,609 B2* | 8/2010 | Kim | G03F 1/36 716/132 |
| 7,836,423 B2 | 11/2010 | Adam | |
| 8,539,393 B2 | 9/2013 | Word | |
| 8,645,880 B2 | 2/2014 | Adam | |
| 9,494,853 B2* | 11/2016 | Li | G03F 1/36 |
| 9,638,994 B2* | 5/2017 | Cheng | G03F 1/36 |
| 2015/0286131 A1* | 10/2015 | Cheng | G03F 1/36 430/5 |

OTHER PUBLICATIONS

P.C.W. Ng et al., "A fully mode-based methodology for simultaneously correcting EUV mask shadowing and optical proximity effects with improved pattern transfer fidelity and process windows," Proc. SPIE 7520, Lithography Asia 2009, 13 pages. (Year: 2009).*

C.-M. Lim et al., "Study on CD variation in the vicinity of the exposure field edge in EUV lithography," Proc. SPIE 8322, Extreme Ultraviolt (EUV) Lithography III, SPIE Advanced Lithography 2012, 11 pages. (Year: 2012).*

Lam et al., "Accurate 3DEMF mask model for full-chip simulation," Proc. SPIE, vol. 8683, 2013, 10 pages.

Schellenberg, "Resolution Enhancement Technology: The Past, the Present, and Extensions for the Future," Proceedings of SPIE vol. 5377, 2004, 21 pages.

K. Adam et al., "Hybrid Hopkins-Abbe method for modeling oblique angle mask effects in OPC," Proc. SPIE 6924 (2008), 13 pages.

* cited by examiner

DYNAMIC MODEL GENERATION FOR LITHOGRAPHIC SIMULATION

RELATED APPLICATIONS

This application claims the benefit of U.S. Provisional Patent Application No. 62/410,147, filed on Oct. 19, 2016, entitled "Dynamic Model Generation In Lithography," and naming Lam et al. as inventors, which application is incorporated entirely herein by reference.

FIELD OF THE DISCLOSED TECHNOLOGY

The present disclosed technology relates to the field of lithography. Various implementations of the disclosed technology may be useful for EUV lithographic simulation.

BACKGROUND OF THE DISCLOSED TECHNOLOGY

Extreme ultra-violet (EUV) Lithography presents a unique challenge for computational lithographers, particularly within the realm of Optical Proximity Correction (OPC) software. While advances in model accuracy are naturally required with each new advanced node due to smaller feature sizes and tighter overlay requirements, EUV lithography adds additional complications not seen previously in deep ultra-violet (DUV) Lithography. Non-telecentric optics produce horizontal and vertical print differences on identical but rotated structures, reflective multilayer optics produce substantially higher aberration levels and stray light scattering (flare), and light reflections from the over-scanned "dark" regions of the mask produce halo exposures in neighboring fields, giving rise to the misnomer "black border modeling". The modeling challenge is heightened since these effects additionally change through field position at a full chip/reticle scale.

An individual lithographic mask will typically contain many product dies ('chips') within a single field. FIG. 3 illustrates an example of multiple dies 310-360 placed on the reticle within the field. The pair of dies 310 and 320 share the same circuit design, and the pair of dies 350 and 360 share the same circuit design. In DUV lithography, OPC on any individual product die is performed independent of its position within the field, meaning OPC is field position independent. A product die could be placed on the left or the right, top or the bottom, without any change to the OPC it received. This had many advantages because identical product die could be corrected a single time, and placed multiple times within the field. From a modeling perspective, OPC models could be considered unchanged everywhere within the field: $M(x,y)=M$, where M is an arbitrary model (resist model, mask electro-magnetic field model, optical illuminating and imaging system model, etc.).

EUV lithography fundamentally alters this paradigm, requiring OPC to operate with knowledge of position in the field, and likewise understand how the underlying OPC models change depending on location. Under EUV lithography, the two product die placements 350 and 360 in FIG. 3 would both receive different OPC since they lie in different positions in the field. The same is true for the two die placements 310 and 320. Field position dependencies arise both from non-idealities in the EUV scanner (flare, aberrations), as well as intrinsic properties engineered into the EUV scanner designs (change of chief ray through slit). Piecewise position-dependent static input model strategies have been used to resolve field position dependencies. However, they produce critical dimension (CD) discontinuities, which leads to real wafer edge placement errors (EPEs).

BRIEF SUMMARY OF THE DISCLOSED TECHNOLOGY

Aspects of the disclosed technology relate to techniques of processing layout designs based on dynamically-generated lithographic models. In one aspect, there is a method comprising: receiving layout data for one or more layout designs; processing the one or more layout designs based on printed features predicted by lithographic simulation, wherein the lithography simulation comprises: selecting a layout feature in the one or more layout designs, generating models for an area where the layout feature is located if the models have not been generated yet, the models comprising an illuminating and imaging system model and a mask electro-magnetic field model, the models being generated based on predetermined models for a region that includes the area, predetermined models for one or more neighboring regions, and location information of the area relative to the region and to the one or more neighboring regions, performing lithographic simulation based on the models to determine printed features for the layout features, and repeating the selecting operation, the generating operation and the performing operation; and storing results of the processed one or more layout designs in a tangible medium.

The mask electro-magnetic field model may be derived based on a domain decomposition method (DDM). The illuminating and imaging system model may be derived based on a sum-of-coherent-systems (SOCS) method. The generating models may comprise: generating the illuminating and imaging system model based on a combination of predetermined illuminating and imaging system models in the predetermined models for the region and predetermined illuminating and imaging system models in the predetermined models for the one or more neighboring regions, the combination comprising changing weight values for kernels. The interpolation may be a linear interpolation or a cubic interpolation.

Alternatively or additionally, the generating models may comprise: generating the mask electro-magnetic field model based on interpolation of predetermined electro-magnetic field models in the predetermined models for the region and predetermined electro-magnetic field models in the predetermined models for the one or more neighboring regions. The interpolation may be a linear interpolation or a cubic interpolation.

The processing the one or more layout designs may comprise: performing an optical proximity correction (OPC) process on the one or more layout designs.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
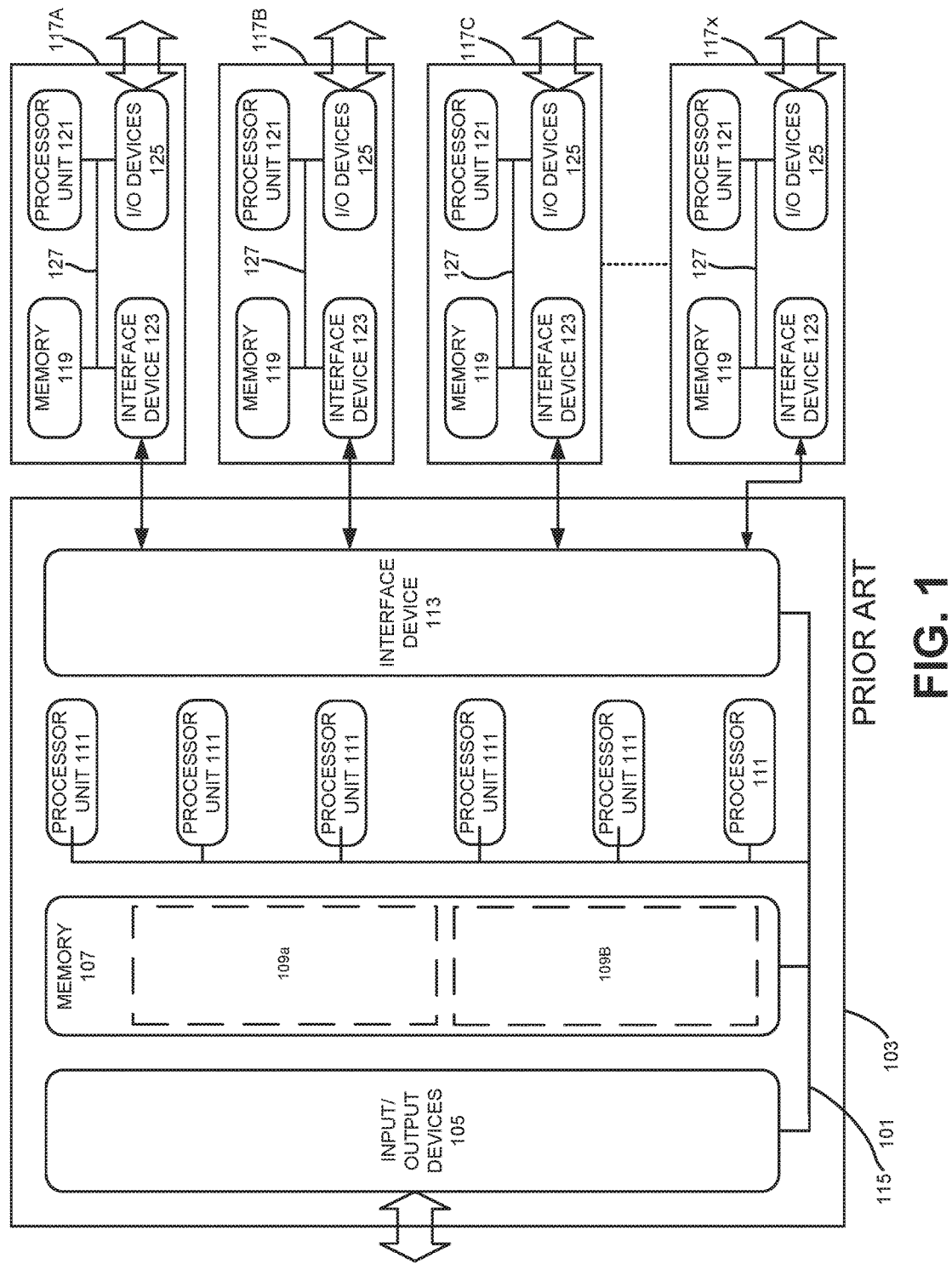
FIG. 1 illustrates an example of a computing system that may be used to implement various embodiments of the disclosed technology.

Various aspects of the present disclosed technology relate to processing layout designs based on dynamically-generated lithographic models. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "process" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
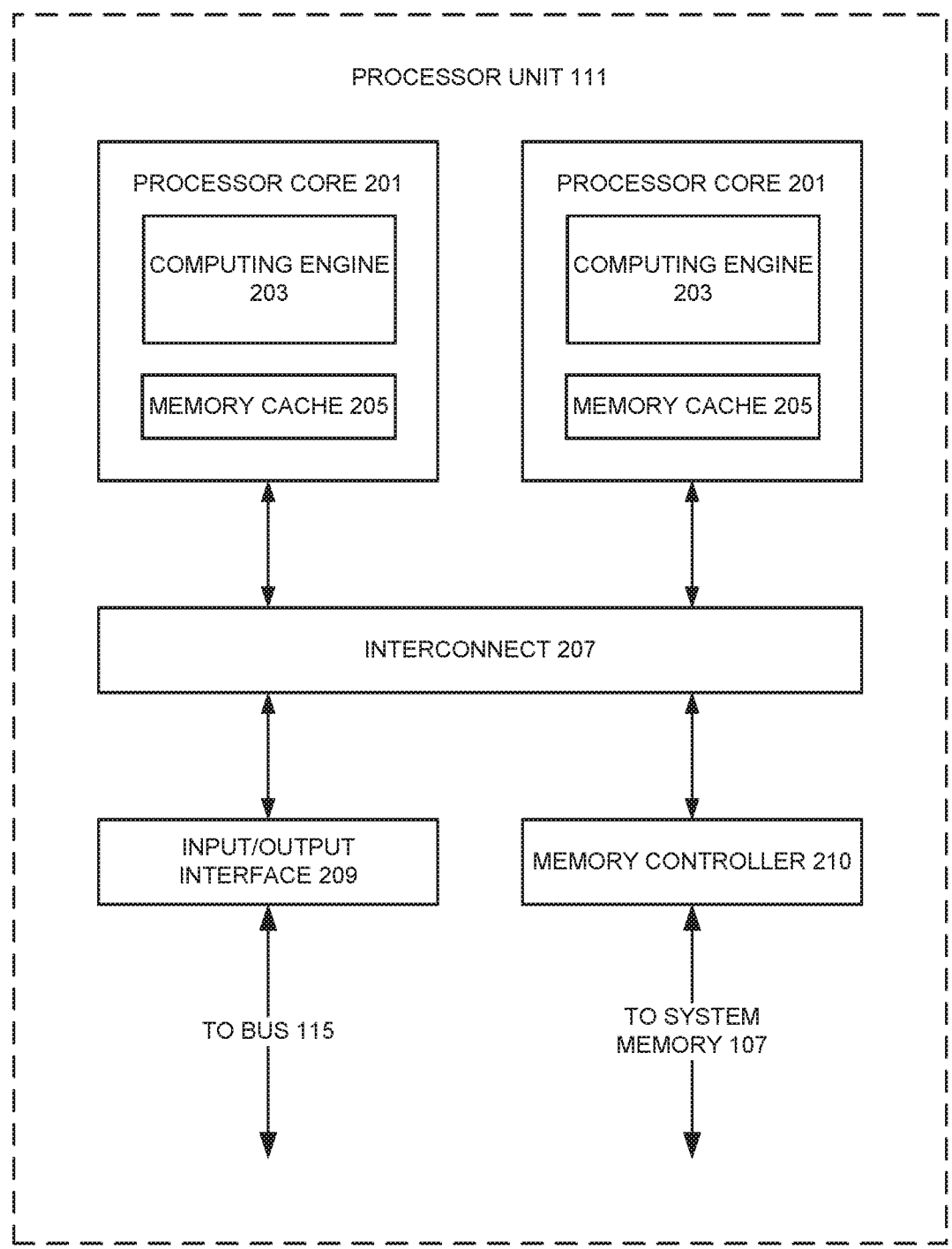
FIG. 2 illustrates an example of a multi-core processor unit that may be used to implement various embodiments of the disclosed technology.
Figure 3:
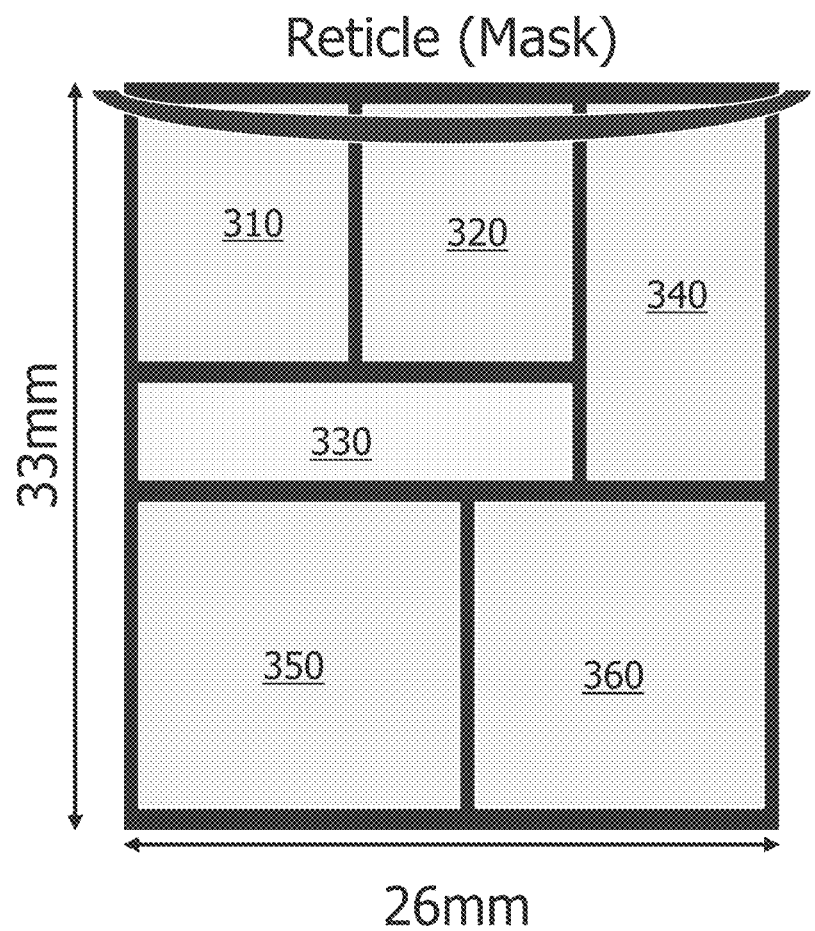
FIG. 3 illustrates an example of multiple dies placed on the reticle within a single field.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the disclosed technology, the processor units 201 may include additional components, such as a high-level cache memory accessible shared by the processor cores 201.

While FIG. 2 shows one illustration of a processor unit 201 that may be employed by some embodiments of the disclosed technology, it should be appreciated that this illustration is representative only, and is not intended to be limiting. For example, some embodiments of the disclosed technology may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/ Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design, Verification and Optical Proximity Correction

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

Figure 4A:
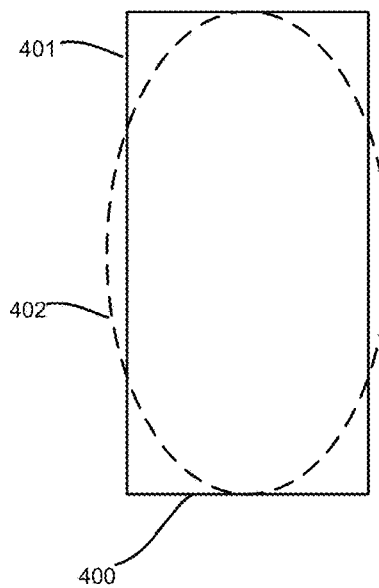
FIG. 4A illustrates a mask feature 400 and a simulated image of the mask feature.

In a conventional OPC process, the edges of the geometric elements in the design are fragmented. For example, as shown in FIG. 4A, an edge of the geometric element 401 used to create a mask feature 400 may be fragmented into edge fragments 401A-401F, shown in FIG. 4B. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments.

Figure 4C:
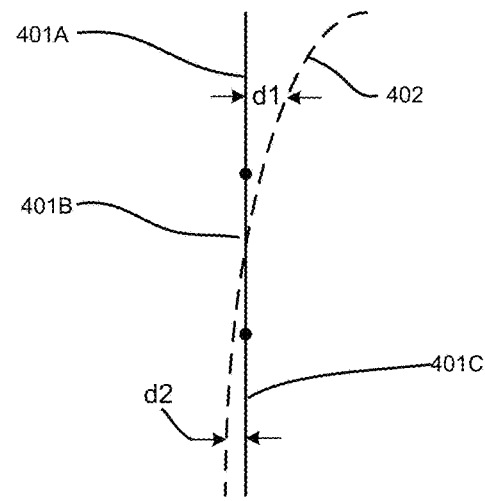
FIG. 4C illustrates edge displacement errors for some of the edge fragments.
Figure 4B:
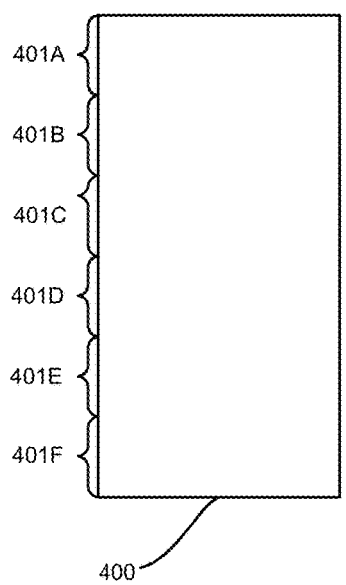
FIG. 4B illustrates an example of fragmentation of an edge of the mask feature 400.

The model-based OPC process also simulates the printed image. That is, the photolithographic process is simulated in order to produce a simulated printed image (referred to as simulated image), such as the example image 402 shown in FIG. 4A. This simulated image is compared to the target image. Typically, this comparison is done at each edge fragment. For example, as shown in FIG. 4C, the target image is a distance d1 away from the simulated image at the edge fragment 401A, the target image is a distance d2 away from the simulated image at the edge fragment 401C, while the target image intersects the simulated image at the edge fragment 401B. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Figure 4D:
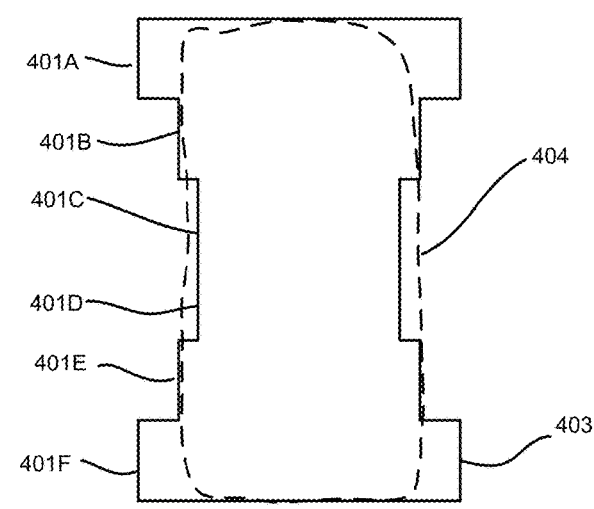
FIG. 4D illustrates a mask feature modified from the mask feature 400 by an OPC process and a corresponding simulated image.

Next, the edge fragments are individually moved or adjusted in order to enable the simulated image for the resulting mask to reproduce the target image as much as possible. For example, as shown in FIG. 4D, the edge fragment 401A is displaced in a direction away from the geometric element 401, in an effort to widen the corresponding portion of the image that would be produced by the resulting mask. Similarly, the edge fragment 401C is displaced in a direction toward from the geometric element 401, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 4C, a subsequent iteration of the optical proximity correction process may move edge fragment 401A a greater amount than edge fragment 401C.

Lithographic Process Models

The performance of an OPC process depends in part on the accuracy and predictability of lithographic process models that mathematically represent the distinct steps in the patterning sequence. These lithographic process models (sometimes also referred to as OPC models) include optical models for aerial image formation and resist/etch process models for the photoresist-associated steps such as exposure, post-exposure bake, development, and pattern transfer. Optical models include illuminating and imaging system models and mask electro-magnetic field models. According to some implementations of the disclosed technology, illuminating and imaging system models and mask electro-magnetic field models are derived based on the sum-of-coherent systems (SOCS) approximation and domain decomposition methods (DDM).

When the illumination of an object originates from a quasi-monochromatic, spatially incoherent light source, as is the case in lithography systems, there exists a method for calculating the image intensity that has the special appeal of conceptual simplicity. First, each point on the light source is considered individually and the image intensity produced by the light emitted from that single point is calculated. Then, the image intensity contributions from all points that comprise the light source are added, with a weighting factor proportional to the source intensity distribution. Simple addition or integration of the image intensity distributions can be performed, since the original source is assumed to be spatially incoherent. This is the theory proposed by Abbe, and the image intensity $I_i$ at point (u,v) can be computed using the following integral:

$$I_i(u, v) = \qquad \text{Eq. 1.}$$
$$\int\int_{-\infty}^{\infty} I_s(\alpha, \beta) \int \int_{-\infty}^{\infty} \int \int K(u, v; x_1, y_1) K^*(u, v; x_2, y_2) \times$$
$$F(x_1, y_1; \alpha, \beta) F^*(x_2, y_2; \alpha, \beta) T_o(x_1, y_1)$$
$$T_o^*(x_2, y_2) dx_1 dy_1 dx_2 dy_2 d\alpha d\beta$$

where $I_s$ is the source intensity, F and K are amplitude spread functions of the illuminating and imaging systems respectively, $T_o$ is the amplitude transmittance of the object (mask) and the asterisk represents complex conjugation.

In the theory proposed by Hopkins the image intensity calculation can alternatively be performed by using the following integral:

$$I_i(u, v) = \int\int_{-\infty}^{\infty} \int\int \left[\int\int_{-\infty}^{\infty} \overline{J_o}(f, g) \overline{K}(f + f', g + g') \qquad \text{Eq. 2.}\right.$$
$$\left. \overline{K}^*(f + f'', g + g'') df dg\right] \times \overline{T_o}(f', g')$$
$$\overline{T_o}^*(f'', g'') e^{-j2\pi[(f'-f'')u+(g'-g'')v]} df' dg' df'' dg''$$

where $J_o$ is the source mutual intensity and the overbars represent Fourier transforms of the respective quantities. The term inside the square brackets is often referred to as the transmission cross-coefficient (TCC) of the optical system. The TCC is independent of the object (the mask in photolithography) and is a complete description of the optical system from source to image plane.

The TCC can be represented as a Hermitian symmetric matrix of values, which can be expanded in terms of its eigenvectors $\Phi_k$. Eq. 2 can then be expressed as:

$$I_i(u, v) = \sum_k \lambda_k |\Phi_k \otimes T_0|^2 \qquad \text{Eq. 3.}$$

where the operator $\otimes$ represents the convolution and $\lambda_k$ is referred to as weights. The eigenvectors $\Phi_k$ are sometimes referred to as kernels, optical kernels or SOCS kernels. These kernels are not of equal importance, and the order of importance coincides with the magnitude of their respective eigenvalue. To increase computation speed and/or reduce required computation resources, the series may be truncated to a smaller discrete number of terms as a fraction of the complete series. The kernels may be selected based on the weight values and/or the magnitudes of eigenvalues to provide adequate simulation accuracy.

Note that the central assumption of Hopkins' theory is that the object transmission is independent of the illumination. As all illumination and imaging parameters are completely modeled in the SOCS kernels along with the weights (referred to as the illumination and imaging system model), the SOCS kernels can be pre-calculated and stored. The aerial images for mask patterns (layout patterns) can then be obtained by insert the mask transmittance function $T_0$ and the illumination and imaging system model into Eq. 3.

The sum of coherent systems (SOCS) approach has been described in detail elsewhere, including in the Ph.D. thesis of Nicolas Cobb, "Fast Optical and Process Proximity Correction Algorithms for Integrated Circuit Manufacturing" University of California, Berkeley, Spring, 1998. It should be noted that although the Hopkins approach is described as being used in the above process, particular embodiments may be applied for any method for which the SOCS approximation is valid.

Various mask electro-magnetic field models have been developed for computing the mask transmittance function $T_0$. Many of these models are based on decomposing mask layouts into individual layout feature components for the rapid and accurate simulation of light scattering from masks. One example is the domain decomposition method (DDM). DDM allows the user to arbitrarily decompose the domain into pieces, and synthesize a near field mask solution from the subsequent building blocks. Details concerning the DDM technology are provided in K. Adam and A. R. Neureuther, "Domain decomposition methods for the rapid electromagnetic simulation of photomask scattering," J. Microlithogr. Microfabrication, Microsyst. 1, 253 (2002); K. Adam, "Modeling of electromagnetic effects from mask topography at full-chip scale," Proc. SPIE 5754, 498 (2004); K. Adam, "Domain Decomposition Methods for the Electromagnetic Simulation of Scattering from Three-Dimensional Structures with Applications in Lithography," Ph.D Dissertation, University of California at Berkeley, 2001; and U.S. Pat. Nos. 7,536,660; 7,539,954; 7,836,423; 8,645,880, all of which are hereby incorporated herein by reference.

The original DDM technique used normal incidence illumination of the mask combined with the Hopkins approximation to model oblique incidence scattering in the illumination. With the rise of hyper-NA lithographic systems, the Hopkins' approximation has been shown to be insufficient for the modeling accuracy needs associated with NA's>1.0. DDM was augmented to incorporate the impact of oblique incidence illumination angles via the Hybrid Hopkins-Abbe (HHA) method, which is discussed in K. Adam et al., "Hybrid Hopkins-Abbe method for modeling oblique angle mask effects in OPC," Proc. SPIE 6924 (2008), which is hereby incorporated herein by reference.

DDM is a valid approximation due to the linearity of the Kirchhoff-Fresnel diffraction integral. The disturbance U (any field component) at a point P behind a mask that is illuminated from a distant point source at $P_0$ can be approximated by the Kirchhoff-Fresnel diffraction integral, as shown in Eq. 4:

$$U(P) = -\frac{jAe^{jkr_0}}{2\lambda r_0} \int_W \int \frac{e^{jks}}{s}(1 + \cos\chi) dS \qquad \text{Eq. 4}$$

where the integral extends over W, the mask's opening. Due to the linearity of the Kirchhoff-Fresnel diffraction integral, for a mask containing multiple openings $W_i$, the Eq. 4 becomes:

$$U(P) = \sum_i U_i(P) \qquad \text{Eq. 5}$$

where $U_i(P)$ represents disturbance caused by each opening separately. Eq. 5 illustrates the essence of the domain decomposition method (DDM): every single opening (mask feature) of a mask may be considered separately and the scattered field below the mask is found as the sum of the scattered fields below each opening.

Rigorous simulation methods may be applied to determine the electromagnetic field below the mask. The determined steady-state near field can be regarded as a rigorous complex mask transmittance function $T_0$, or the r-mask model (a mask electro-magnetic field model). The r-mask model accurately describes the scattering field near the mask. However, the simulation process can be computationally expensive even for a single rectangular mask opening due to the nature of three-dimensional simulation. The mask transmittance function $T_0$ may also be approximated by a function consisting of a piecewise constant function coinciding with the ideal mask transmission properties. This mask transmittance function $T_0$ is called the k-mask model (a mask electro-magnetic field model). While no simulation is needed for determining the k-mask model, the k-mask model breaks down when either the minimum mask dimension layout feature is comparable to or less than the illumination wavelength, or the vertical structure of the mask is comparable to or greater than the illumination wavelength.

Quasi-rigorous DDMs have been developed to achieve acceptable simulation accuracy without performing the slow three-dimensional simulation. In one quasi-rigorous DDM, each mask feature may be decomposed into one-dimensional features and a two-dimensional k-mask feature. For example, the scattering field below the mask for one feature can be derived by combining the scattering fields for two one-dimensional features and then subtracting the scattering field for a two-dimensional feature. The scattering field for the two-dimensional feature is described by a k-mask model and thus its determination requires no simulation. The scattering fields for the two one-dimensional features can be obtained by executing two-dimensional simulations. To further speed up the process, the simulation results for one-dimensional features may be calculated and converted to transmission functions, i.e. the modified k-mask models. The modified k-mask models may then be stored in look-up tables for calculating aerial images for all mask features. Various function forms such as the rectangular form and the Gaussian form may be used for the modified k-mask models. The modified k-mask models for one-dimensional features in this quasi-rigorous DDM are referred to as DDM signals.

Figure 5:
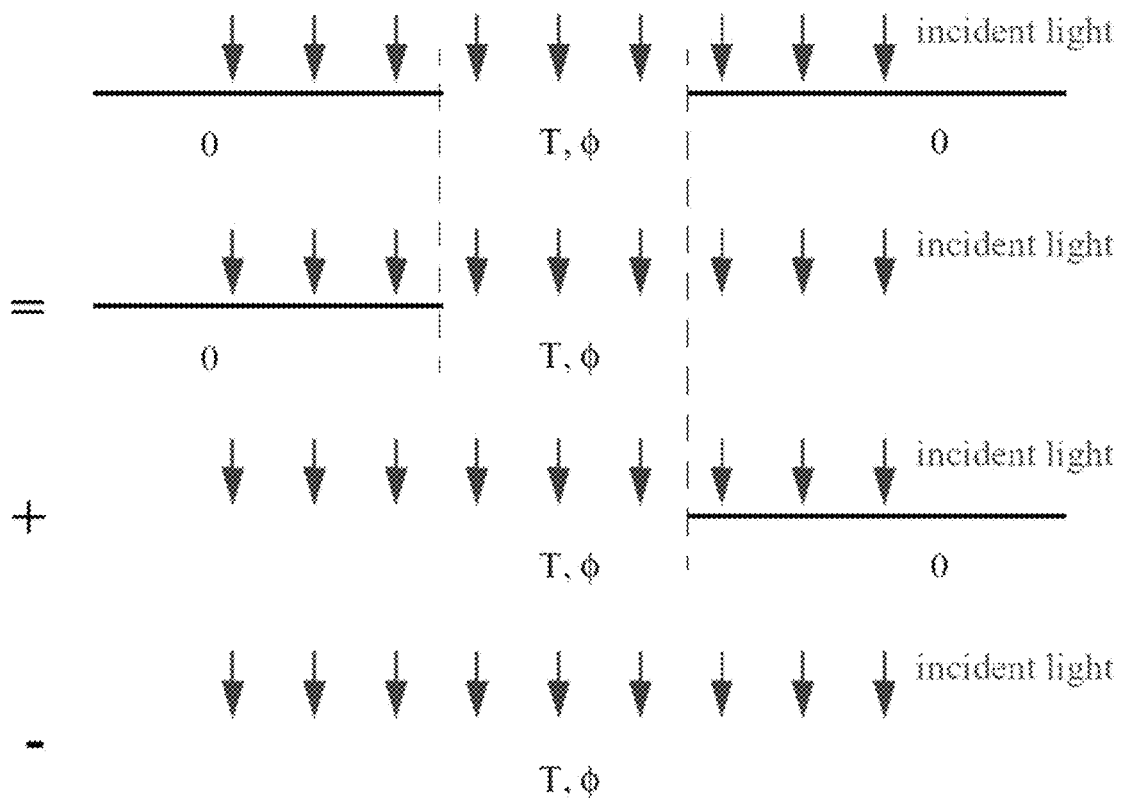
FIG. 5 illustrates an example of a one-dimensional mask opening being decomposed into two edges and a uniform field.

In another quasi-rigorous DDM, referred to as the edge-DDM, each mask feature is decomposed into edges. FIG. 5 illustrates an example of a one-dimensional mask opening being decomposed into two edges and a uniform field. The field across the observation plane (wafer plane) can be obtained based on the scattered fields for the two edges that can be determined by two-dimensional simulations. The application of the edge-DDM in two-dimensional layout features is straightforward. No matter how complicated the mask technology is, usually only a small number of different types of edges are present in the layout. Depending on the orientation of an edge in a layout feature, the edge "sees" and responds to the incident field differently. If the illuminated field is a TE normally incident plane wave and the edge is oriented along the y-axis, it "sees" TE illumination; but if it is oriented along the x-axis, it "sees" TM illumination. The response of each edge to its respective illumination can be taken into account rigorously from a pre-stored two-dimensional edge diffraction simulation. Corner effects may be effectively ignored, since the finite extent of each edge is not rigorously taken into account. Instead, the scattered field at the end points of every edge is abruptly terminated (truncated) in a perfect square-wave fashion to the field value of the k-mask model. Corner effects in typical imaging situations are mapped at the extremities of the spectra and usually do not contribute to the image formation. In this edge-DDM, the two dimensional edge diffraction simulation results are referred to as DDM signals, or more specifically edge-based DDM signals.

The above quasi-rigorous DDM methods are described in K. Adam, "Domain Decomposition Methods for the Electromagnetic Simulation of Scattering from Three-Dimensional Structures with Applications in Lithography," Electronics Research Laboratory, University of California, Berkeley, 2001, which is incorporated herein by reference. As noted previously, further additions to and/or improvement over the original DDM methods have been made including the incorporation of the impact of oblique incidence illumination angles via the Hybrid Hopkins-Abbe (HHA) method and the crosstalk modeling for DUV lithography.

When features on the order of the wavelength (at mask dimensions) and below are simulated with DDM, the assumption of isolated layout feature component near fields (e.g., edge near fields) that interact solely based on superposition begins to break down and a layout feature component to layout feature component interaction in the near field begins to become noticeable. One layout feature component on the mask electromagnetically interacting with another layout feature component on the mask in the near field (i.e., not yet propagating through the optical system) is referred to as crosstalk for mask diffraction/scattering (or crosstalk). This crosstalk between layout feature components such as edges can produce CD errors that are unacceptable in today's advanced processing nodes where every nm of error needs to be controlled as tightly as possible.

For deep ultraviolet (DUV) lithography, crosstalk occurs because light scattering from a single edge can be diffracted to large angles, which can propagate across a section of the mask, and re-scatter from a second edge. The highly oblique light from the first scattering would normally propagate outside the optical system (not collected) because the NA of the system is too small to resolve such high frequency information. When two edges are placed in close proximity to each other, however, highly obliquely scattered waves may propagate across the mask and re-scatter from a nearby edge and be redirected towards the collection optic, causing an impact on imaging. A crosstalk solution is discussed in Lam et al., "Accurate 3 DEMF mask model for full-chip simulation," Proc. SPIE, vol. 8683, 2013, which is hereby incorporated herein by reference.

Unlike deep ultraviolet (DUV) lithography systems such as the 193 nm system, EUV lithography systems cannot use refractive optical elements because materials at EUV wavelengths have refractive indices which are extremely close to 1.0 (the same as air), making it difficult to bend the highly energetic light based on Snell's Law. Instead, reflective optical elements such as mirrors are needed. EUV masks also need to work in a reflective mode. A typical EUV projection printing system includes multiple mirrors. At the mask plane, the chief ray is off-axis by roughly 6 degrees but is perpendicular to the image plane (wafer plane). Thus, the system is telecentric at the wafer plane, but non-telecentric at the mask plane. Moreover, since materials at EUV wavelengths have refractive indices which are extremely close to 1.0, very small amounts of energy fare contained within any reflection or diffraction (especially to high angles) because the amount of scattered energy is related to the difference in refractive indices between two mediums. Due to these differences between deep ultraviolet (DUV) lithography and extreme ultraviolet (EUV) lithography, the fundamental physical mechanism underlying crosstalk is different between the two technologies and a crosstalk solution for DUV is not effective for EUV. An EUV crosstalk model is disclosed in U.S. Pat. No. 10,067,425, which is hereby incorporated herein by reference.

Layout Design Processing Tool

Figure 6:
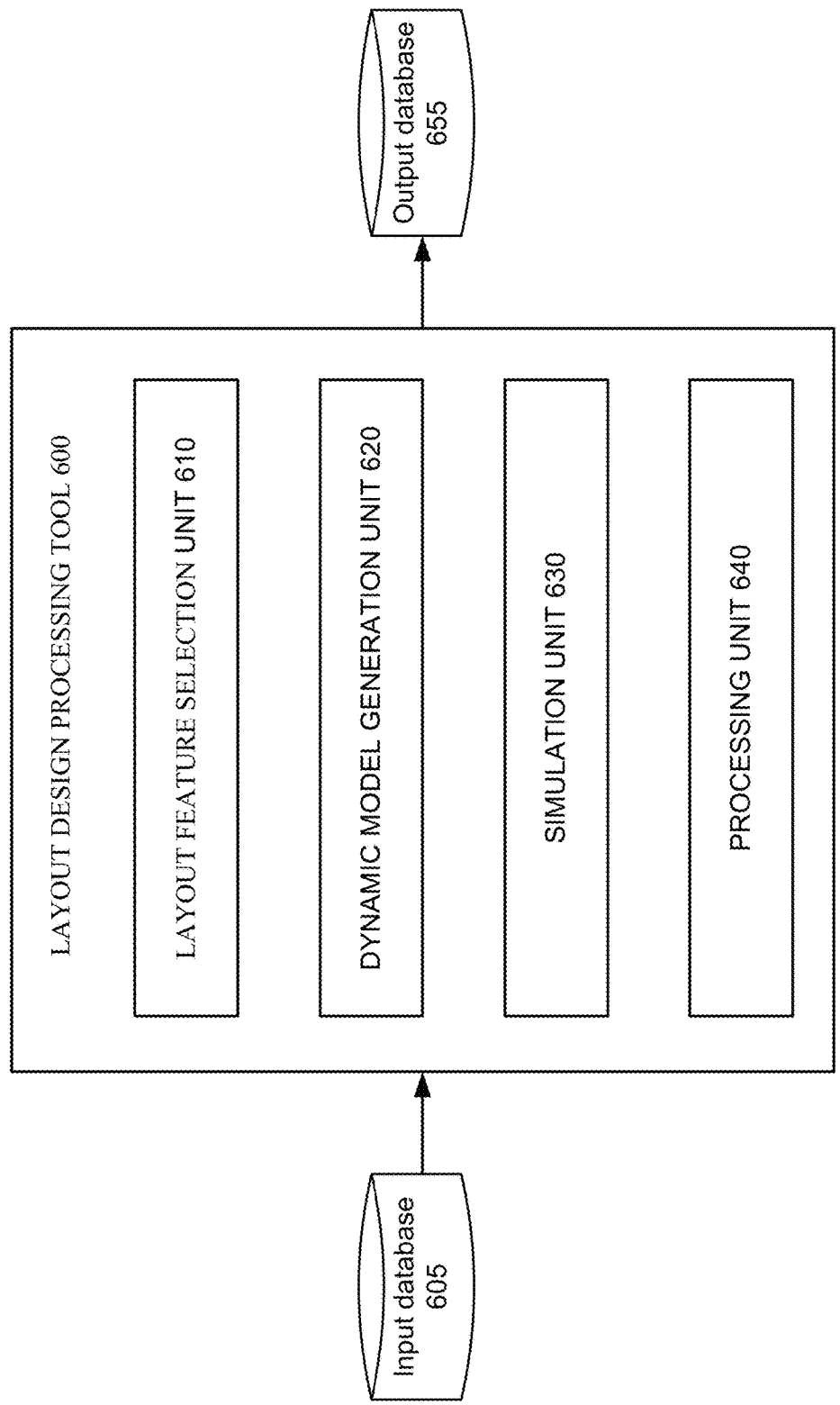
FIG. 6 illustrates an example of a layout design processing tool according to various embodiments of the disclosed technology.

FIG. 6 illustrates an example of a layout design processing tool 600 according to various embodiments of the disclosed technology. As seen in this figure, the layout design processing tool 600 includes a layout feature selection unit 610, a dynamic model generation unit 620, a simulation unit 630, and a processing unit 640. Some implementations of the layout design processing tool 600 may cooperate with (or incorporate) one or more of an input database 605 and an output database 655.

As will be discussed in more detail below, the layout design processing tool 600 can receive layout data for one or more layout designs from the input database 605. The layout feature selection unit 610 selects a section of layout features for simulation. The dynamic model generation unit 620 generates models for a simulation area where the layout features are located if the models have not been generated yet. The models comprise an illuminating and imaging system model and a mask electro-magnetic field model and are generated based on predetermined models for a region that includes the simulation area, predetermined models for one or more neighboring regions, and location information of the simulation area relative to the region and to the one or more neighboring regions. The simulation unit 630 performs lithographic simulation based on the models to determine printed features for the layout features. The processing unit 640 processes the one or more layout designs based on the printed feature. The layout design processing tool 600 stores results of the processed one or more layout designs in the output database 655.

As previously noted, various examples of the disclosed technology may be implemented by one or more computing systems, such as the computing system illustrated in FIGS. 1 and 2. Accordingly, one or more of the layout feature selection unit 610, the dynamic model generation unit 620, the simulation unit 630, and the processing unit 640 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the layout feature selection unit 610, the dynamic model generation unit 620, the simulation unit 630, and the processing unit 640. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the layout feature selection unit 610, the dynamic model generation unit 620, the simulation unit 630, and the processing unit 640 are shown as separate units in FIG. 6, a single computer (or a single processor within a master computer) or a single computer system may be used to implement all of these units at different times, or components of these units at different times.

With various examples of the disclosed technology, the input database 605 and the output database 655 may be implemented using any suitable computer readable storage device. That is, either of the input database 605 and the output database 655 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 605 and the output database 655 are shown as separate units in FIG. 6, a single data storage medium may be used to implement some or all of these databases.

Correcting EUV Crosstalk Effect

Figure 7:
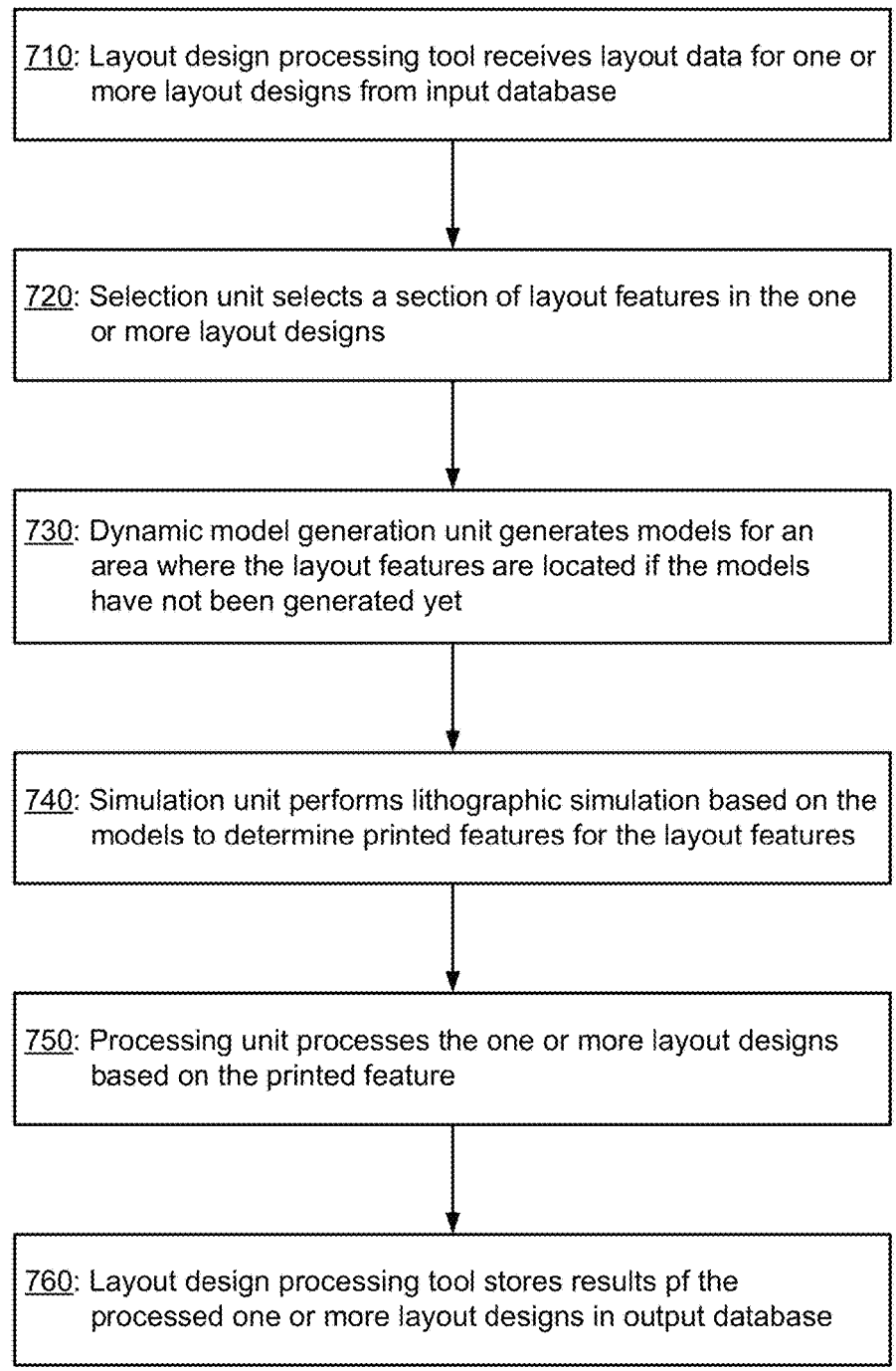
FIG. 7 illustrates a flowchart showing a process of processing layout designs based on dynamically-generated lithographic models that may be implemented according to various examples of the disclosed technology.

FIG. 7 illustrates a flowchart 700 showing a process of processing layout designs based on dynamically-generated lithographic models that may be implemented according to various examples of the disclosed technology. For ease of understanding, methods of processing layout designs based on dynamically-generated lithographic models that may be employed according to various embodiments of the disclosed technology will be described with reference to the layout design processing tool 600 in FIG. 6 and the flow chart 700 illustrated in FIG. 7. It should be appreciated, however, that alternate implementations of a layout design processing tool may be used to perform the methods of processing layout designs based on dynamically-generated lithographic models illustrated by the flow chart 700 according to various embodiments of the disclosed technology. Likewise, the layout design processing tool 600 may be employed to perform other methods of processing layout designs based on dynamically-generated lithographic models according to various embodiments of the disclosed technology.

In operation 710, the layout design processing tool 600 receives layout data for one or more layout designs. The layout data for one or more layout designs may be retrieved from the input database 705.

In operation 720, the layout feature selection unit 610 selects a section of layout features for simulation. In some embodiments of the disclosed technology, a layout feature may be a polygon, an edge of or an edge segment of a polygon. In some other embodiments of the disclosed technology, a layout feature may be a plurality of polygons, a plurality of edges or a plurality of edge segments in an area. In still some other embodiments of the disclosed technology, a layout feature may be geometric elements in a specific area. For example, in some OPC technology, a layout design is divided into plurality of rectangle/square areas which are sometimes referred to as "tiles". The size of a tile may be 25 um×25 um for example. Each of the tiles may be divided into smaller areas (e.g., 7 um×7 um) which are sometimes referred to as "frames". In this case, the specific area may be a frame.

In operation 730, the dynamic model generation unit 620 generates models for an area where the layout features are located if the models have not been generated yet. The models comprise an illuminating and imaging system model and a mask electro-magnetic field model. The illuminating and imaging system model may be derived based on a sum-of-coherent-systems (SOCS) method. An example of the illuminating and imaging system model is shown by the SOCS kernels $\Phi_k$ along with the weights $\lambda_k$ shown in Eq. 3. The mask electro-magnetic field model may be derived based on a domain decomposition method (DDM). An example of the mask electro-magnetic field model is using edge-based DDM to model the mask transmittance function $T_0$ as discussed previously.

Figure 8:
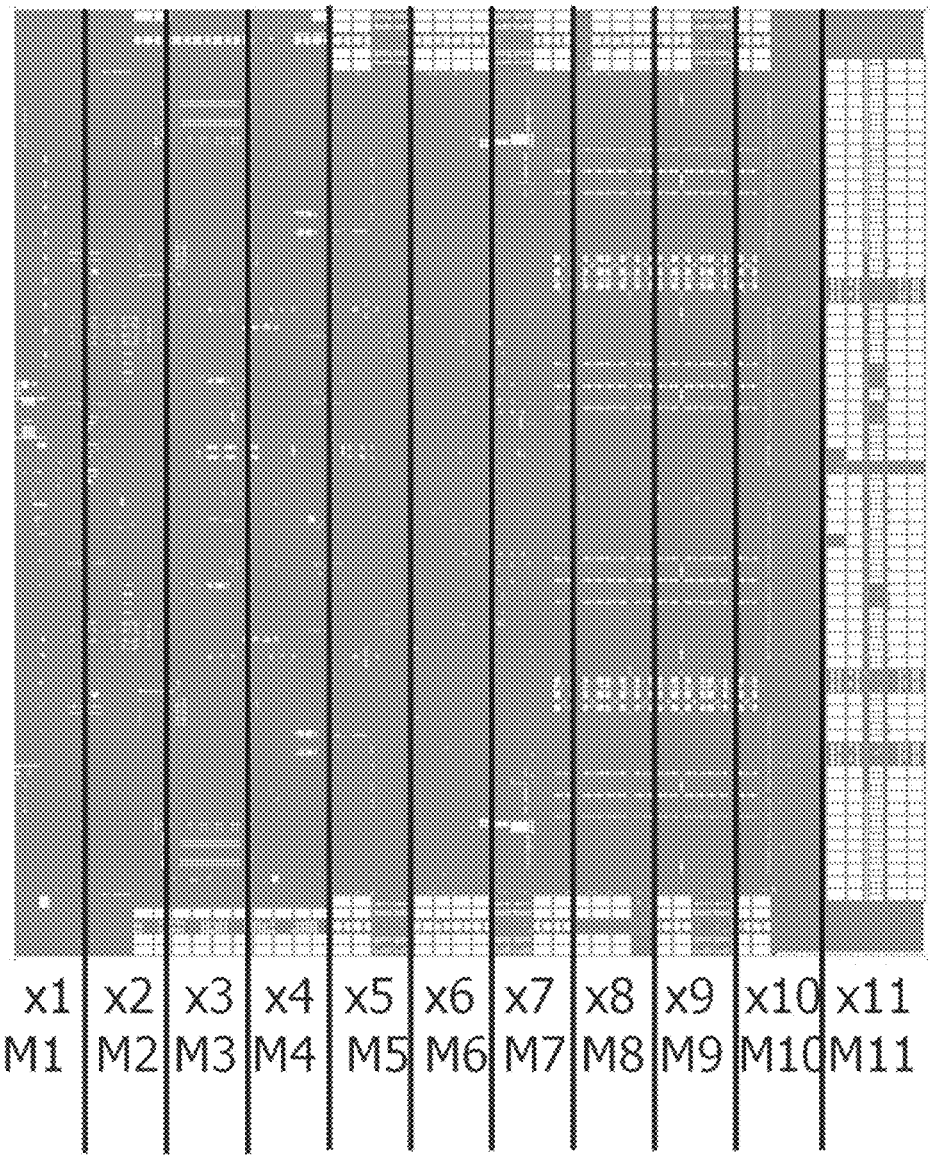
FIG. 8 illustrates an example of a reticle being sliced into 11 regions.
Figure 9:
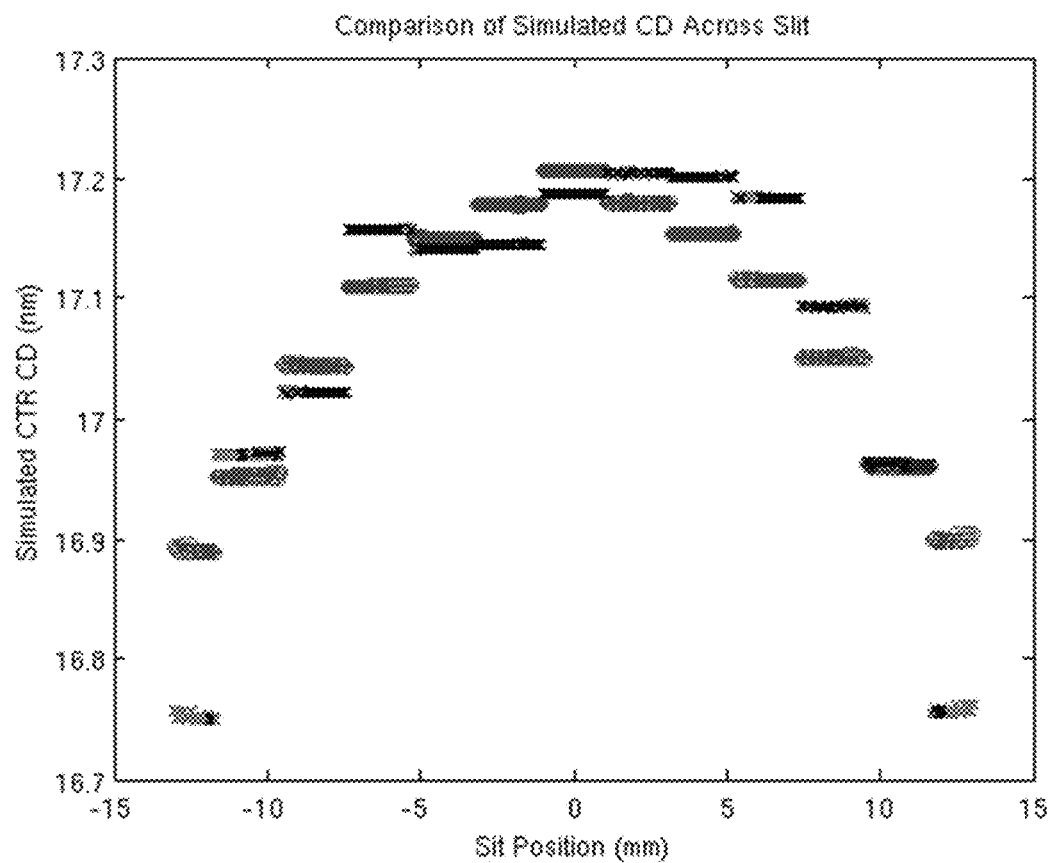
FIG. 9 illustrates an example of piecewise constant CD caused by using static predetermined models.

These lithographic process models can be pre-calculated for a plurality of vertical stripe regions. FIG. 8 illustrates an example of a reticle being sliced into 11 regions. Each of the eleven regions has unique predetermined lithographic models. Simulating printed features directly using these predetermined models can lead to piecewise constant CD behavior as shown in FIG. 9, In the figure, the red color lines are derived using the same illuminating and imaging system models and the same mask electro-magnetic field model for each of the vertical stripe regions. Dividing the reticle into too narrow regions may solve the problem, but is impractical as more computing time and/or resources are needed.

With various implementations of the disclosed technology, the models for the area where the layout feature is located are generated based on predetermined models for a region that includes the area, predetermined models for one or more neighboring regions, and location information of the area relative to the region and to the one or more neighboring regions. In some embodiments, the generation employs an interpolation method.

As described previously, edge-based DDM may be employed to derive the mask electro-magnetic field model. Edges are basic building blocks of three dimensional features on a mask. Each feature can be decomposed into edges. No matter how complicated the mask technology is, usually only a small number of different types of edges are present in the layout. Depending on the orientation of an edge in a layout feature, the edge "sees" and responds to the incident field differently. An electromagnetic field (EMF) solver to derive DDM signals for a number of different types of edges (e.g., different orientations) for each of the plurality of vertical stripe regions. The electromagnetic field solver is typically a tool based on solving Maxwell's equations. The computed edge-based DDM signals may be stored in a lookup table. In a conventional approach, mask electro-magnetic field signals (diffraction signals) for edges of the layout features in a vertical stripe region can be quickly determined by directly using the edge-based DDM signals for that vertical stripe region stored in the lookup table. With some implementations of the disclosed technology, the dynamic model generation unit 620 interpolates the edge-based DDM signals for the vertical stripe region that includes the area and for its nearest neighboring region based on their location relationship to generate edge-based DDM signals for the area where the layout feature is located and use these newly-generated edge-based DDM signals for layout features in the area which is much smaller than a vertical stripe region. The interpolation may be a linear interpolation or a cubic interpolation.

The illuminating and imaging system model may be generated based on a combination of predetermined illuminating and imaging system models in the predetermined models for the region and predetermined illuminating and imaging system models in the predetermined models for the one or more neighboring regions. Each of the plurality of vertical stripe regions may, for example, have a specific number of kernels along with weight values pre-determined and stored. The dynamic model generation unit 620 may combine the kernels for the vertical tripe region that includes the area and for its nearest neighboring region to generate a new set of kernels for the smaller area where the layout feature is located. As such, the new set of kernels may have twice the number of kernels in each of the stored kernel sets for the plurality of vertical stripe regions. It should be noted that some of the kernels may be removed if, for example, their contributions are small. It should also be noted that the dynamic model generation unit 620 may combine the kernels for the vertical tripe region that includes the area and for more than one of its neighboring regions to generate a new set of kernels for the smaller area where the layout feature is located.

The dynamic model generation unit 620 may change the weight values for the kernels based on the location information of the area relative to the region and to its nearest neighboring region. An interpolation may be employed to derive the new weight values. For example, the illuminating and imaging system model may be a linear interpolation (Model=A1*Model1+A2*Model2) between the illuminating and imaging system models for the vertical tripe region that includes the area (Model1) and for its nearest neighboring region (Model2). The weight values for the combined kernels may be derived by multiplying the original weight values with the corresponding linear interpolation coefficients ($\lambda_{1k}$*A1, $\lambda_{2k}$*A2).

Figure 10:
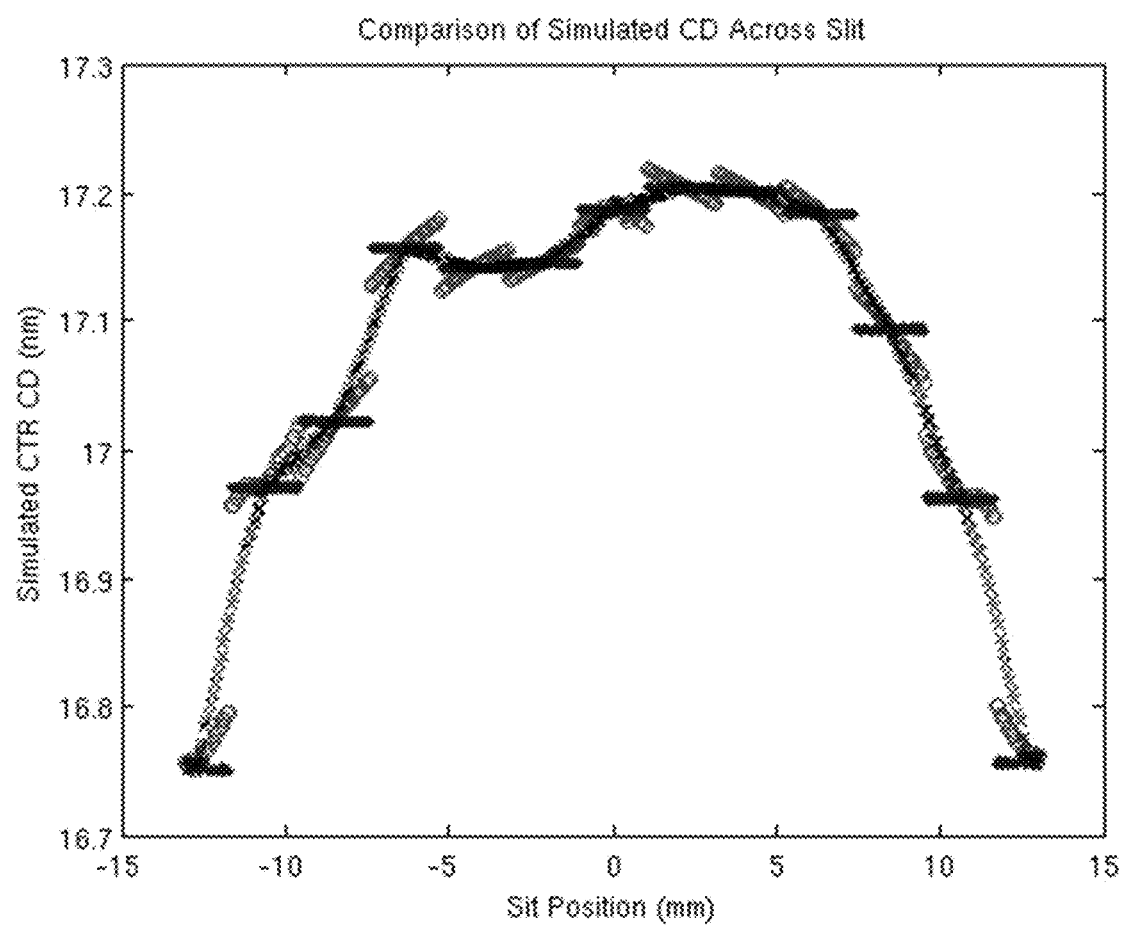
FIG. 10 illustrates an example of simulated CD across a slit using dynamic model generation for the illuminating and imaging system model only (red color), for the mask electromagnetic field model only (blue color), and for both the two models (black color).

In the example shown in FIG. 9, 1000-2000 illuminating and imaging system models/mask electro-magnetic field models for smaller vertical sub-regions may be generated "on the fly". FIG. 10 shows results of using dynamic model generation for the illuminating and imaging system model only (red color), for the mask electro-magnetic field model only (blue color), and for both the two models (black color). As the figure shows, the CD discontinuity disappears when both the illuminating and imaging system model and the mask electro-magnetic field model are generated dynamically.

In operation 740, the simulation unit 630 performs lithographic simulation based on the generated models to determine printed features for the layout features.

In operation 750, the processing unit 640 processes the one or more layout designs based on the printed feature. The processing unit 640 may perform an optical proximity correction (OPC) process on the one or more layout designs. The processing unit 640 may, additionally or alternatively, identify potentially problematic patterns (sometimes referred to as process hotspots). These process hotspots may be changed automatically or manually to ensure high fabrication yield.

In operation 760, the layout design processing tool 600 stores results of the processed one or more layout designs in a tangible medium (e.g. the output database 655).

CONCLUSION

While the disclosed technology has been specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
receiving layout data for one or more layout designs;
processing the one or more layout designs based on printed features predicted by lithographic simulation, wherein the lithography simulation comprises:
selecting a section of layout features in the one or more layout designs,
generating models for an area where the layout features are located, the models comprising an illuminating and imaging system model and a mask electro-magnetic field model, the models being generated based on predetermined models for a region that includes the area, predetermined models for one or more neighboring regions, and location information of the area relative to the region and to the one or more neighboring regions,
performing lithographic simulation based on the models to determine printed features for the layout features, and
repeating the selecting operation, the generating operation and the performing operation; and
storing results of the processed one or more layout designs in a tangible medium.

2. The method recited in claim 1, wherein the processing the one or more layout designs comprises performing an optical proximity correction (OPC) process on the one or more layout designs.

3. The method recited in claim 1, wherein the mask electro-magnetic field model is derived based on a domain decomposition method (DDM).

4. The method recited in claim 1, wherein the generating models comprises:
generating the mask electro-magnetic field model based on interpolation of predetermined electro-magnetic field models in the predetermined models for the region and predetermined electro-magnetic field models in the predetermined models for the one or more neighboring regions.

5. The method recited in claim 4, wherein the interpolation is a linear interpolation or a cubic interpolation.

6. The method recited in claim 1, wherein the illuminating and imaging system model is derived based on a sum-of-coherent-systems (SOCS) method.

7. The method recited in claim 6, wherein the generating models comprises:
generating the illuminating and imaging system model based on a combination of predetermined illuminating and imaging system models in the predetermined models for the region and predetermined illuminating and imaging system models in the predetermined models for the one or more neighboring regions, the combination comprising changing weight values for kernels.

8. One or more non-transitory computer-readable media storing computer-executable instructions for causing one or more processors to perform a method, the method comprising:
receiving layout data for one or more layout designs;
processing the one or more layout designs based on printed features predicted by lithographic simulation, wherein the lithography simulation comprises:
selecting a section of layout features in the one or more layout designs,
generating models for an area where the layout features are located, the models comprising an illuminating and imaging system model and a mask electro-magnetic field model, the models being generated based on predetermined models for a region that includes the area, predetermined models for one or more neighboring regions, and location information of the area relative to the region and to the one or more neighboring regions,
performing lithographic simulation based on the models to determine printed features for the layout features, and
repeating the selecting operation, the generating operation and the performing operation; and
storing results of the processed one or more layout designs in a tangible medium.

9. The one or more non-transitory computer-readable media recited in claim 8, wherein the processing the one or more layout designs comprises performing an optical proximity correction (OPC) process on the one or more layout designs.

10. The one or more non-transitory computer-readable media recited in claim 8, wherein the mask electro-magnetic field model is derived based on a domain decomposition method (DDM).

11. The one or more non-transitory computer-readable media recited in claim 8, wherein the generating models comprises:
generating the mask electro-magnetic field model based on interpolation of predetermined electro-magnetic field models in the predetermined models for the region and predetermined electro-magnetic field models in the predetermined models for the one or more neighboring regions.

12. The one or more non-transitory computer-readable media recited in claim 11, wherein the interpolation is a linear interpolation or a cubic interpolation.

13. The one or more non-transitory computer-readable media recited in claim 8, wherein the illuminating and imaging system model is derived based on a sum-of-coherent-systems (SOCS) method.

14. The one or more non-transitory computer-readable media recited in claim 13, wherein the generating models comprises:
generating the illuminating and imaging system model based on a combination of predetermined illuminating and imaging system models in the predetermined models for the region and predetermined illuminating and imaging system models in the predetermined models for the one or more neighboring regions, the combination comprising changing weight values for kernels.

15. A system, comprising:
one or more processors, the one or more processors programmed to perform a method, the method comprising:
receiving layout data for one or more layout designs;
processing the one or more layout designs based on printed features predicted by lithographic simulation, wherein the lithography simulation comprises:
selecting a section of layout features in the one or more layout designs,
generating models for an area where the layout features are located, the models comprising an illuminating and imaging system model and a mask electro-magnetic field model, the models being generated based on predetermined models for a region that includes the area, predetermined models for one or more neighboring regions, and location information of the area relative to the region and to the one or more neighboring regions, performing lithographic simulation based on the models to determine printed features for the layout features, and repeating the selecting operation, the generating operation and the performing operation; and storing results of the processed one or more layout designs in a tangible medium.

16. The system recited in claim 15, wherein the processing the one or more layout designs comprises performing an optical proximity correction (OPC) process on the one or more layout designs.

17. The system recited in claim 15, wherein the mask electro-magnetic field model is derived based on a domain decomposition method (DDM).

18. The system recited in claim 15, wherein the generating models comprises:

generating the mask electro-magnetic field model based on interpolation of predetermined electro-magnetic field models in the predetermined models for the region and predetermined electro-magnetic field models in the predetermined models for the one or more neighboring regions.

19. The system recited in claim 18, wherein the interpolation is a linear interpolation or a cubic interpolation.

20. The system recited in claim 15, wherein the illuminating and imaging system model is derived based on a sum-of-coherent-systems (SOCS) method.

21. The system recited in claim 20, wherein the generating models comprises:

generating the illuminating and imaging system model based on a combination of predetermined illuminating and imaging system models in the predetermined models for the region and predetermined illuminating and imaging system models in the predetermined models for the one or more neighboring regions, the combination comprising changing weight values for kernels.

\* \* \* \* \*